United States Patent
Kim et al.

(10) Patent No.: US 7,974,375 B2
(45) Date of Patent: Jul. 5, 2011

(54) LINEAR PHASE DETECTOR AND CLOCK/DATA RECOVERY CIRCUIT THEREOF

(75) Inventors: Chul-Woo Kim, Nowon-gu (KR);
Seok-Soo Yoon, Suwon-si (KR);
Young-Ho Kwak, Gangnam-gu (KR);
In-Ho Lee, Anyang-si (KR); Ki-Hong Kim, Hwaseong-si (KR)

(73) Assignees: Samsung Electronics Co., Ltd., Suwon-si, Gyeonggi-do (KR); Korea University Industrial & Academic Collaboration Foundation, Seoul (KR)

( * ) Notice: Subject to any disclaimer, the term of this patent is extended or adjusted under 35 U.S.C. 154(b) by 887 days.

(21) Appl. No.: 11/843,785

(22) Filed: Aug. 23, 2007

(65) Prior Publication Data

US 2008/0049884 A1 Feb. 28, 2008

(30) Foreign Application Priority Data

Aug. 24, 2006 (KR) .................... 10-2006-0080716

(51) Int. Cl.
*H03D 3/24* (2006.01)
(52) U.S. Cl. ........ 375/376; 375/360; 375/374; 327/235; 327/244

(58) Field of Classification Search .................. 375/316, 375/354, 359–360, 369–371, 373–376; 327/100, 327/141, 144, 146–148, 152, 155–157, 231, 327/233–236, 243–245
See application file for complete search history.

(56) References Cited

U.S. PATENT DOCUMENTS

| | | | |
|---|---|---|---|
| 2004/0120441 A1 | 6/2004 | Karlquist | |
| 2007/0021933 A1* | 1/2007 | Sanduleanu et al. | 702/72 |
| 2007/0286321 A1* | 12/2007 | Gupta et al. | 375/375 |

FOREIGN PATENT DOCUMENTS

| | | |
|---|---|---|
| JP | 2004208298 | 7/2004 |
| KR | 100261287 B1 | 4/2000 |
| KR | 1020010097285 A | 11/2001 |

* cited by examiner

*Primary Examiner* — Kevin M Burd
*Assistant Examiner* — James M Perez
(74) *Attorney, Agent, or Firm* — Volentine & Whitt, PLLC

(57) ABSTRACT

A linear phase detector includes an up/down pulse generator operating in response to received data signals and a recovered clock signal. The phase detector generates up and down pulses that have pulse widths proportional to the phase differences between transitions of the received data signals and edges of the recovered clock signal. By generating up and down pulses using a linear phase detector in proportion to a phase error, data signals are effectively recovered, even data signals with significant jitter.

11 Claims, 10 Drawing Sheets

LINEAR PHASE DETECTOR AND CLOCK/DATA RECOVERY CIRCUIT THEREOF

CROSS-REFERENCE TO RELATED APPLICATION

This U.S. non-provisional patent application claims priority under 35 U.S.C. §119 of Korean Patent Application No. 2006-80716 filed on Aug. 24, 2006, the entire contents of which are hereby incorporated by reference.

BACKGROUND OF THE INVENTION

1. Field of the Invention

Embodiments of the invention relate to phase detectors. More particularly, embodiments of the invention relate to linear phase detectors used for data recovery.

2. Discussion of Related Art

In general, clock/data recovery circuits (CDRs) are used to provide clocks necessary for recovering digital signals at receiving stages of high-frequency data communication systems such as optical communication systems, backplane routing systems, or chip-to-chip interconnection systems. Depending on whether or not a reference clock is provided from an external crystal oscillator, CDR structures may be differentiated into a recovering clock without using a reference clock and a recovering clock using a reference clock. A recovering clock that does not use a reference clock extracts frequency information directly from input data by means of a frequency detector. A recovering clock which utilizes a reference clock generates a clock of the same frequency with a bit rate of input data via the external clock and a clock divider.

A phase detector (PD) determines the operation speed of the CDR. The phase detector must be operable in high speeds for detecting a phase difference between data and the clock. Typical phase detectors include linear and binary detectors both of which effect overall operating characteristics. In particular, a linear phase detector detects phase incline as early phase or late phase. However, a linear phase detector is unable to use multiple phases requiring system circuits to operate at the same rate with input data. For example, when recovering data of 10 Gbps, there is an operational burden of operating all circuits including the phase detector at a rate suitable for the data rate of 10 Gbps. Therefore, it is not easy to implement a linear phase detector suitable for a CDR requiring a high operation rate.

A nonlinear phase detector operates to detect whether a phase is early or late. A binary phase detector only detects the direction of a phase error regardless of its size. Consequently, when input data has associated jitters, the response characteristic of the system varies. Additionally, a nonlinear phase detector is incapable of conducting an analyzing operation by a linear time-invariant (LTI) as compared with a linear phase detector. This is because an output voltage of the phase detector is operable in a nonlinear characteristic making it difficult to determine operational characteristics of the entire circuit in design.

The number of operating times of a charge pump is smaller in the linear phase detector as compared to the nonlinear phase detector. This reduces the number of ripples of a control voltage from a voltage-controlled oscillator (VCO). Thus, the linear phase detector is advantageous for input data having low jitters. Most phase detectors employ differential exclusive logic circuits for detecting error signals corresponding to phase differences between data and clock signals. A detected error signal has a smaller signal width than a unit interval (UI). Phase detectors employing such a differential exclusive logic circuit have error signals with smaller signal widths. These signal widths are several tens to several ps smaller than 100 ps as the data rate increases over 10 Gb/s. Because of these smaller signal widths it may be unable to detect such a small error signal via a differential exclusive logic circuit. Therefore, an operation rate of a CDR is restricted by the operation rate of the differential exclusive logic circuit.

SUMMARY OF THE INVENTION

Exemplary embodiments of the present invention are directed to a linear phase detector capable of efficiently recovering data with large jitters by generating up and down pulses in proportion to a phase error. In an exemplary embodiment, the linear phase detector includes a data transition detector for receiving data signals. The phase detector is configured to determine whether a transition is present in the received data signals. An up/down pulse generator is coupled to the data transition detector and receives the data signals and a recovered clock signal. The up/down pulse generator generates up and down pulses that have pulse widths proportional to the phase differences between transitions of the received data signals and edges of the recovered clock signal. A multiplexer is coupled to the data transition detector and the up/down pulse generator. The multiplexer receives a selection signal from the transition detector and outputs up and down pulses at the transitions of the data signals.

DESCRIPTION OF EMBODIMENTS

Figure 1:
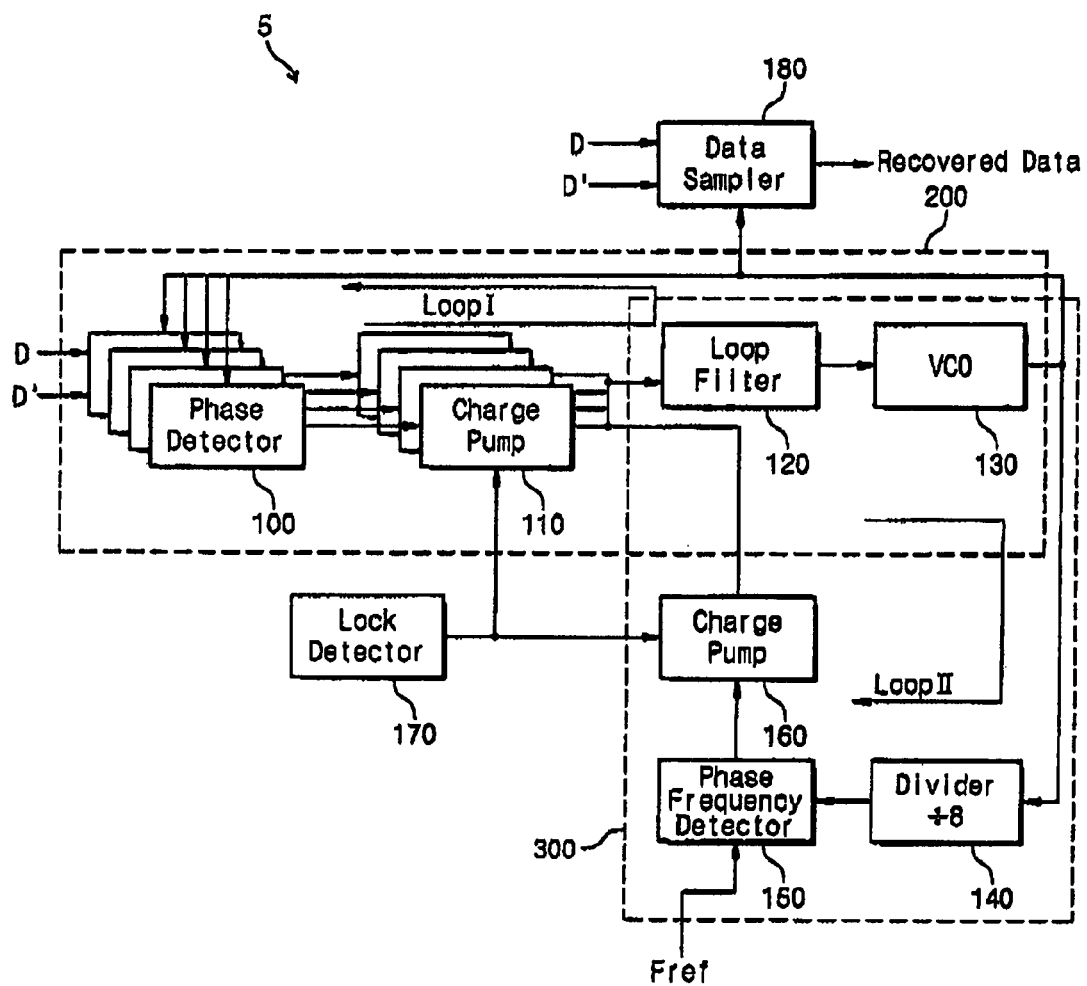
FIG. 1 is a block diagram of a clock/data recovery circuit having dual loop architecture.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

FIG. 1 is a block diagram of a clock/data recovery circuit (CDR) 5 having formed in dual loop architecture organized with clock/data recovery circuit 200 as comprising loop I, frequency-locked loop 300 as loop II, lock detector 170, and data sampler 180. Frequency-locked loop 300 includes phase frequency detector 150, charge pumps 110 and 160, loop filter 120, voltage-controlled oscillator 130, and voltage divider 140. The frequency-locked loop 300 functions to fix a frequency by inputting a reference frequency clock Fref and cycling loop II. Phase frequency detector 150 receives the reference frequency clock Fref, and compares an output of the voltage-controlled oscillator 130 divided by voltage divider 140 with the reference frequency clock Fref. Charge pump 160 generates a control voltage proportional to a pulse provided from phase frequency detector 150. Loop filter 120 functions to pass only a frequency component which is less than a required frequency from the outputs of charge pumps 110 and 160. Voltage-controlled oscillator 130 oscillates a corrected clock and frequency divider 140 divides a frequency in order to compare the corrected clock with the reference frequency clock Fref.

Clock/data recovery circuit 200 compares phases of data D and D' with those of recovered clocks of cycling loop I. CDR 200 then fixes a phase of a clock of the voltage-controlled oscillator 130. Clock/data recovery circuit 200 includes four phase detectors 100, four charge pumps 110, loop filter 120, and voltage-controlled oscillator (VCO) 130. The four phase detectors 100 compare the phases of data D and D' with the phases of the recovered clocks and outputs four signals having different phases than VCO 130. The four charge pumps 110 receive pulses corresponding to the phase differences from phase detectors 100 and the output voltages. Loop filter 120 receives the voltages from the four charge pumps 110 corresponding with the phase differences and passes a voltage lower than a required frequency. In this manner, charge pumps 110 and loop filter 120 provide a control circuit for controlling VCO 130. The control circuit generates a control voltage to control VCO 130 and VCO 130 oscillates the recovered clock in response to the control voltage of the control circuit. Lock detector 170 functions to determine whether a clock frequency of frequency divider 140 matches with reference frequency clock Fref. Data sampler 180 generates recovered data from the sampling transmitted data by a recovered clock.

Figure 2:
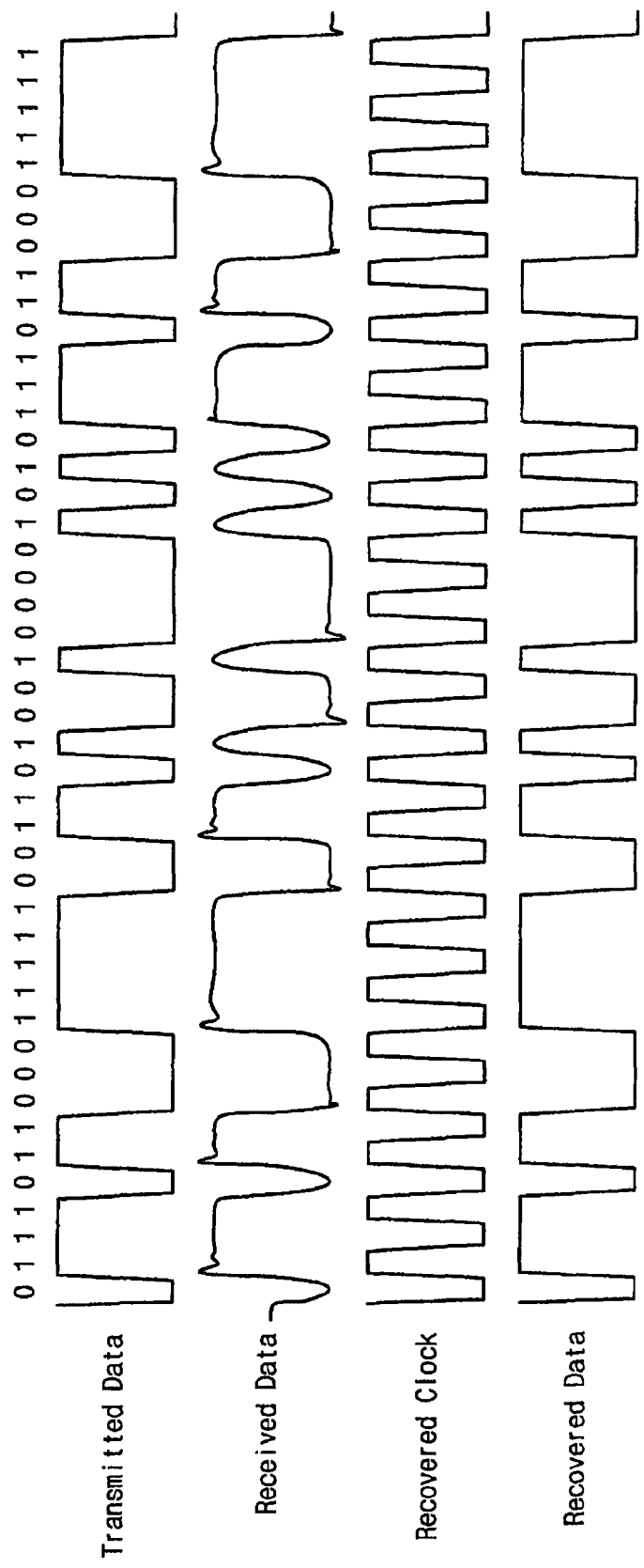
FIG. 2 is a timing diagram for comparing transmitted data, received data, a recovered clock, and recovery data with each other.

FIG. 2 is a timing diagram for comparing transmitted data, received data, recovered clock, and recovery data. When transmitted data is transferred through a transmission path, data D and D' are distorted as illustrated by the received data signals. By applying the recovered clock signal, recovered data is obtained which corresponds to the transmitted data signal.

Figure 3:
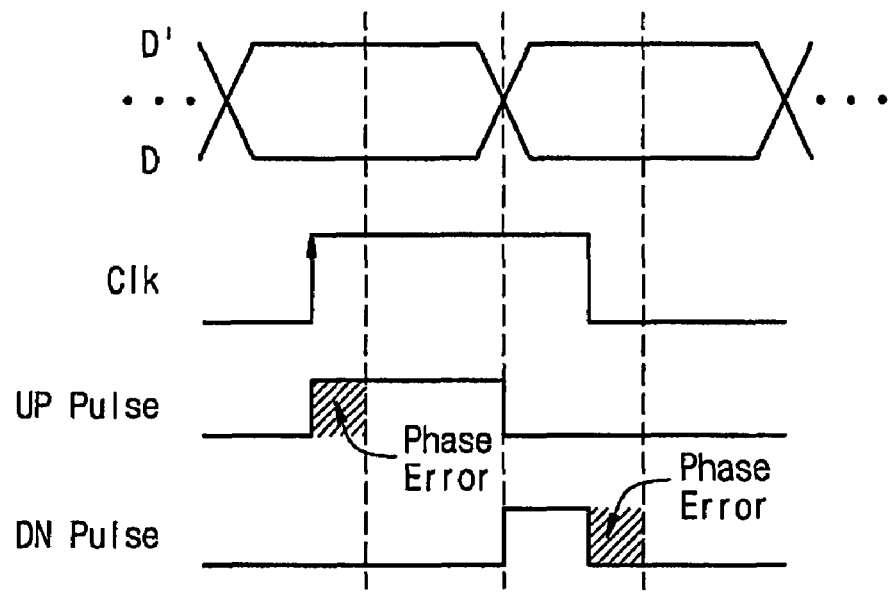
FIGS. 3 and 4 are timing diagrams showing tracking modes of the phase detector shown in FIG. 1.
Figure 4:
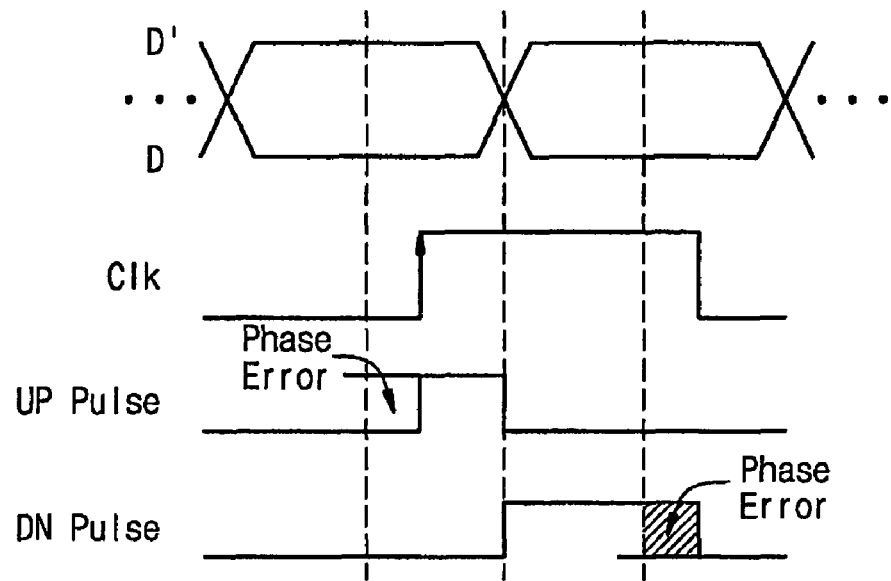

FIGS. 3 and 4 are portions of timing diagrams illustrating the tracking modes of phase detector 100. Clock signal Clk is early phased to the left of the center between the edges of data signals D or D'. Clock signal Clk shown in FIG. 4 is late phased to the right of center between the edges of data signals D or D'. Generally, a tracking mode means moving a clock with up and down pulses according to a rising edge of the clock to the center of the data signal. Because a timing margin is largest when a rising edge of the clock is placed on the center of the data signal, data sampling is more accurate when recovering data. Accordingly, phase detector 100 generates the up and down pulses by comparing the clock signal Clk with edges of the data signals D and D'. As summarized by Equation 1, phase detector 100 generates the up (UP1-UP4) and down (DN1-DN4) pulses by means of two different clocks outputted by VCO 130 and data Q and Qb which are latched data from data signals D and D' corresponding to data transition points. For example, up pulse 1 (UP1) is the result of clock signal CLK1, clock signal CLK4 and latched data Q. Down pulse 1 (DN1) is the result of clock signal CLK1, clock signal CLK4 and latched data Qb $$UP1 = Clk1 \cdot Clk4 \cdot Q$$

$$DN1 = Clk1 \cdot Clk4 \cdot Qb$$

$$UP2 = Clk1 \cdot Clk2 \cdot Q$$

$$DN2 = Clk1 \cdot Clk2 \cdot Qb$$

$$UP3 = Clk2 \cdot Clk3 \cdot Q$$

$$DN3 = Clk2 \cdot Clk3 \cdot Qb$$

$$UP4 = Clk3 \cdot Clk4 \cdot Q$$

$$DN4 = Clk3 \cdot Clk4 \cdot Qb \qquad \text{[Equation 1]}$$

Figure 5:
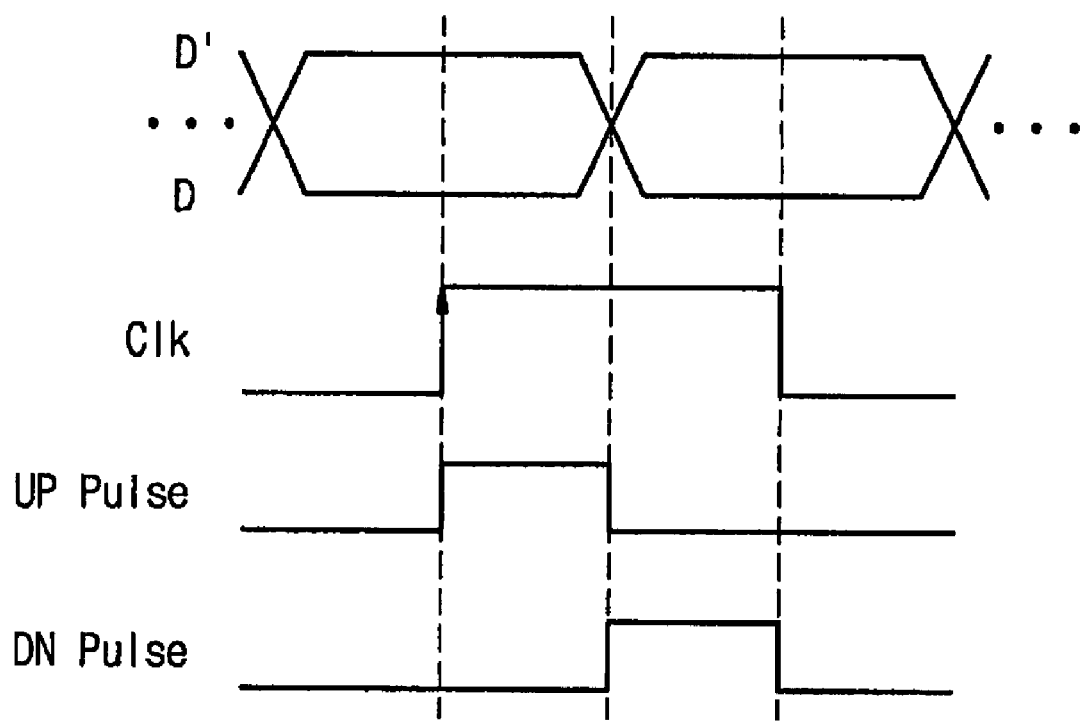
FIG. 5 is a timing diagram showing an after-locking mode of the phase detector shown in FIG. 1.

FIG. 5 is a timing diagram showing an after-locking mode of phase detector 100 shown in FIG. 1. The term "Locking" means an operation for generating up and down pulses during a tracking mode according to a rising edge of a clock to the center of the data signal. The up and down pulses have the same width. The term "After-locking" means a status after phase detector 100 is locked. While the phase detector 100 is being conditioned in the after-locking mode, the up pulse signal (UP Pulse) and down pulse signal (DN Pulse) have the same width and the rising edge of clock signal CLK is placed on the center of the data signal D or D'.

Phase detector 100 generates the up and down pulses (UP Pulse, DN Pulse) during the tracking mode. The up and down pulses are output as voltages through charge pumps 110 and input to VCO 130 via loop filter 120. VCO 130 corrects the clock signal Clk. Phase detector 100 gradually decreases the phase error during the tracking mode and then the up (UP Pulse) and down (DN Pulse) pulses have the same width. Because phase detector 100 is conditioned in a locking state, it does not generate a phase error and data sampler 180 samples data in sync with the rising edge of clock signal CLK from the after-locking condition.

Assuming that a bandwidth of input data is 10 Gbps, phase detector 100 operates in accordance with 10 Gbps. Thus, a clock used in the phase detector 100 is also used with four multi-phase clocks having quarter-rate operation frequencies of 2.5 Gbps to reduce the operating burden of VCO 130. In this manner, the clock/data recovery circuit operates in high bandwidth regions by means of four phase detectors and four multi-phase clocks.

Figure 6:
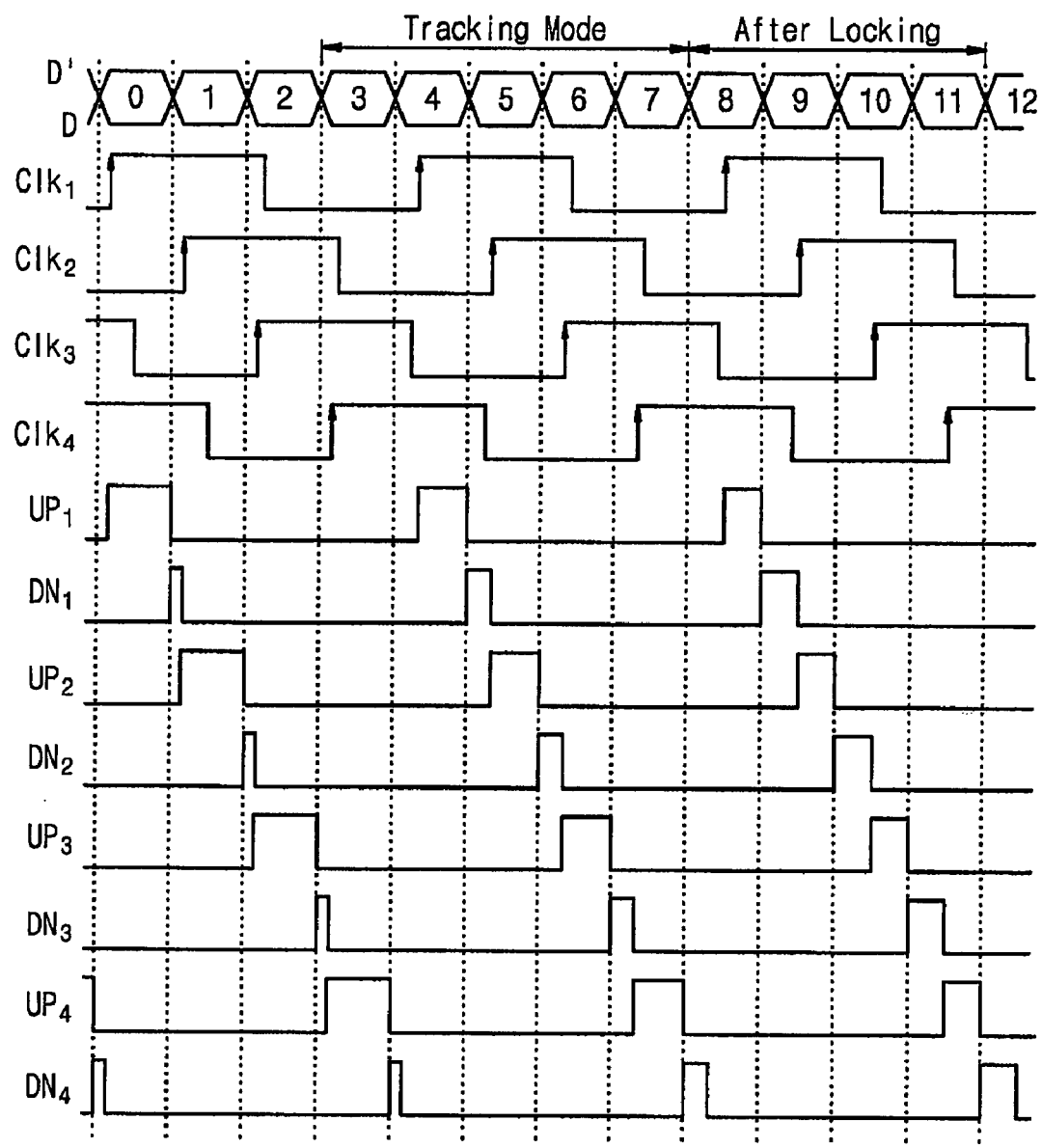
FIG. 6 is a timing diagram of the phase detector shown in FIG. 1.

FIG. 6 is a timing diagram of the phase detector shown in FIG. 1. When the reference frequency clock Fref of 312.5 MHz is input to phase frequency detector 150, the phase frequency detector 150 generates a pulse corresponding to the difference between reference frequency clock Fref and a frequency of a clock from frequency divider 140. This pulse is transferred to charge pump 160 which outputs a voltage signal based on a target clock frequency. Loop filter 120 transfers the input voltage signal only to VCO 130. The frequency output from VCO 130 is 2.5 GHz. A clock output from VCO 130 serves as an input to frequency divider 140 which outputs a clock of 312.5 MHz by dividing the rising and falling edges of the quarter-rate clock from VCO 130.

The lock detector 170 determines whether the reference frequency clock Fref matches the clock frequency of frequency divider 140; if so, the clock associated with VCO 130 is fixed in phase by way of loop I. Phase detector 100 generates the up (UP Pulse) and down (DN Pulse) pulses proportional to the phase differences between transitions of the transmitted data D and D' signals and the edges of the recovered clock signal outputted from VCO 130. These up (UP Pulse) and down (DN Pulse) pulses are supplied to charge pump 110. The recovered clock signal is generated from combining multi-phase clocks of VCO 130. For example, a recovered clock for generating the up and down pulses UP1 and DN1 is obtained by AND-gating clocks Clk1 and Clk4. Charge pump 110 outputs a voltage proportional to a pulse width of the up and down pulses to VCO 130 through loop filter 120 and VCO 130 oscillates a recovered clock signal.

As illustrated in the timing diagram of FIG. 6, during the tracking mode, the four phase detectors 100 synchronize data D and D' signals to the four clocks Clk1, Clk2, Clk3, and Clk4 for sampling. During the after-locking operation, data sampler 180 recovers the data D and D' signals from sampling the data D and D' into the four clocks Clk1, Clk2, Clk3, and Clk4. For example, during the tracking mode, the first phase detector of the four phase detectors 100 generates the up and down pulses UP1 and DN1 from synchronizing data '4' with Clk1. The second phase detector of the four phase detectors 100 generates the up and down pulses UP2 and DN2 from synchronizing data '5' with Clk2. The third phase detector of the four phase detectors 100 generates the up and down pulses UP3 and DN3 from synchronizing data '6' with Clk3. The fourth phase detector of the four phase detectors 100 generates the up and down pulses UP4 and DN4 from synchronizing data '7' with Clk4.

During the after-locking operation, data sampler 180 samples data '8' in sync with a rising edge of Clk1. Data sampler 180 samples data '9' in sync with a rising edge of Clk2. Data sampler 180 samples data '10' in sync with a rising edge of Clk3. Data sampler 180 samples data '11' in sync with a rising edge of Clk4. Because it is difficult for the phase detectors 100 to generate up and down pulses swinging from 0V to 1.8V with a phase error of 50 ps, the pulse widths of the up and down pulses are increased at the same rate. In particular, phase detector 100 generates up and down pulses with a phase error of 150 ps. These up and down pulses are generated by adding a pulse of 100 ps to the up and down pulses by means of an AND gate circuit and two clocks which are different in phase by 90° associated with the 2.5 GHz VCO.

Figure 7:
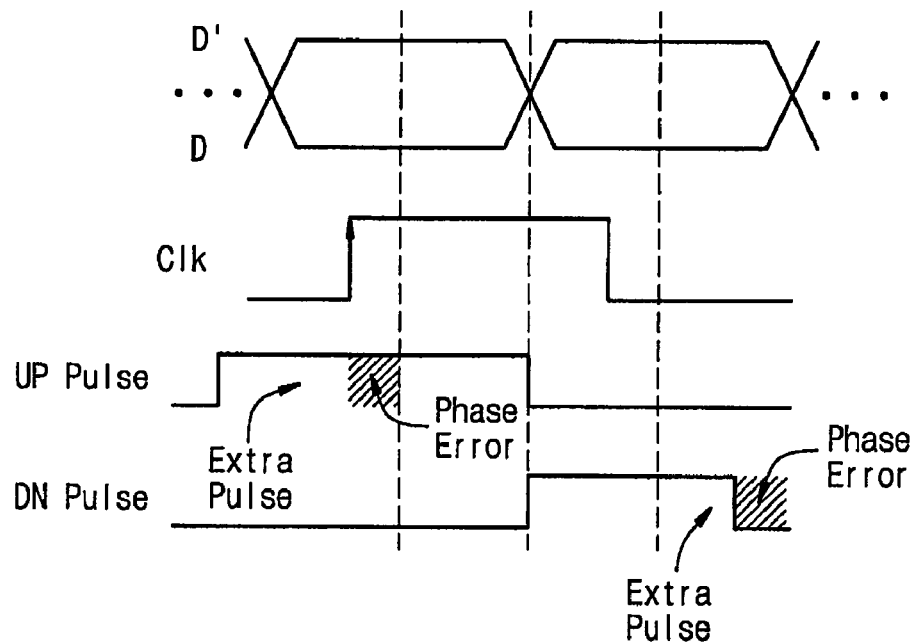
FIGS. 7 and 8 are timing diagrams showing patterns of adding extra pulses to up and down pulses in the tracking mode of the phase detector shown in FIG. 1.
Figure 8:
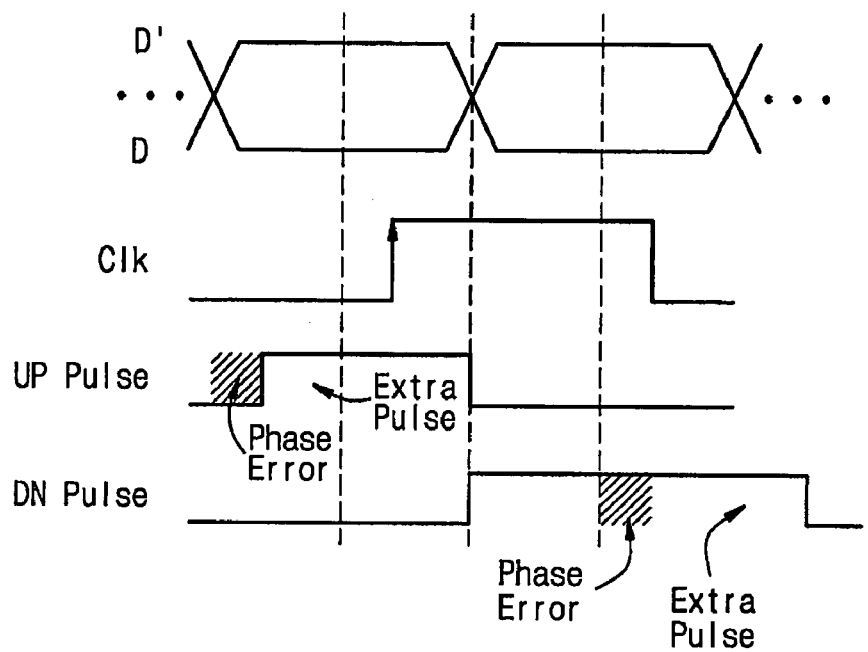

FIGS. 7 and 8 are timing diagrams showing patterns of adding extra pulses to the up and down pulses UP and DN in the tracking mode of the phase detector 100. Clock Clk shown in FIG. 7 is early phased to the left of center of the data signal while clock Clk shown in FIG. 8 is late phased to the right of the data signal. Extra pulses of the same size are added to up (UP) and down (DN) pulses generated from phase detector 100. As can be seen by Equation 2, the extra pulses are generated at the up and down pulses UPi and DNi by means of different clocks at a quarter-rate. These extra pulses act to extend pulse widths associated with the up and down pulses. For example, extra pulses Clk3·Clk4 is added to the up pulse UP1 by the first phase detector of the four phase detectors 100 and extra pulses Clk1·Clk2 is added to the down pulse DN1 by the first phase detector.

$$UP1 = Clk1 \cdot Clk4 \cdot Q + Clk3 \cdot Clk4$$

$$DN1 = Clk1 \cdot Clk4 \cdot Qb + Clk1 \cdot Clk2$$

$$UP2 = Clk1 \cdot Clk2 \cdot Q + Clk1 \cdot Clk4$$

$$DN2 = Clk1 \cdot Clk2 \cdot Qb + Clk2 \cdot Clk3$$

$$UP3 = Clk2 \cdot Clk3 \cdot Q + Clk1 \cdot Clk2$$

$$DN3 = Clk2 \cdot Clk3 \cdot Qb + Clk3 \cdot Clk4$$

$$UP4 = Clk3 \cdot Clk4 \cdot Q + Clk2 \cdot Clk3$$

$$DN4 = Clk3 \cdot Clk4 \cdot Qb + Clk1 \cdot Clk4 \quad \text{[Equation 2]}$$

Figure 9:
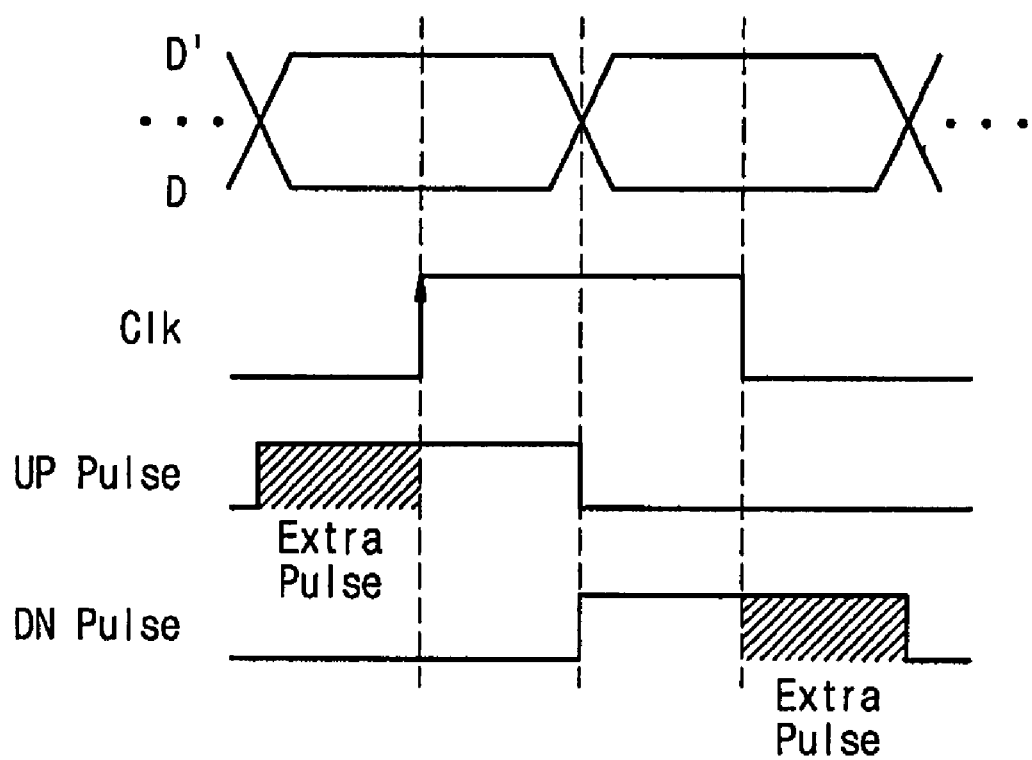
FIG. 9 is a timing diagram showing patterns of adding extra pulses to up and down pulses in the tracking mode of the phase detector shown in FIG. 1.

FIG. 9 is a timing diagram showing patterns of adding extra pulses to up UPi and down pulses DNi in the after-locking mode of phase detector 100. After locking the phase detector, pulse widths of up (UP Pulse) and down (DN Pulse) pulses are extended by adding extra pulses. Data shown in FIG. 6 corresponds to the case of detecting a phase error where there is the largest transition between the signals. However, because the data is randomly generated, a detector is needed for sensing data transitions to effectively detect a phase error.

Figure 10:
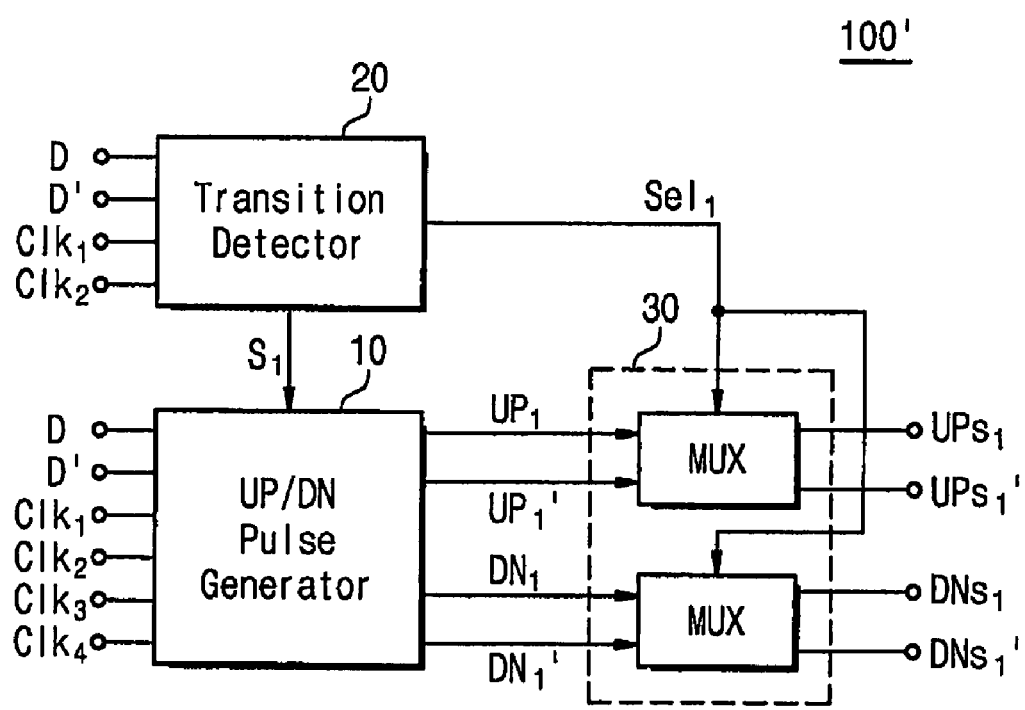
FIG. 10 is a block diagram of a phase detector according to the present invention.

FIG. 10 is a block diagram of a phase detector 100' including an up/down (UP/DN) pulse generator 10, transition detector 20, and multiplexer (MUX) 30. Up/down pulse generator 10 receives a data stream and generates up and down pulses at the data transition points (i.e., edges). Transition detector 20 determines whether there is a transition in the received data stream. Multiplexer 30 receives selection signal Sel from transition detector 20 and outputs up and down pulses when a data transition occurs.

Figure 11:
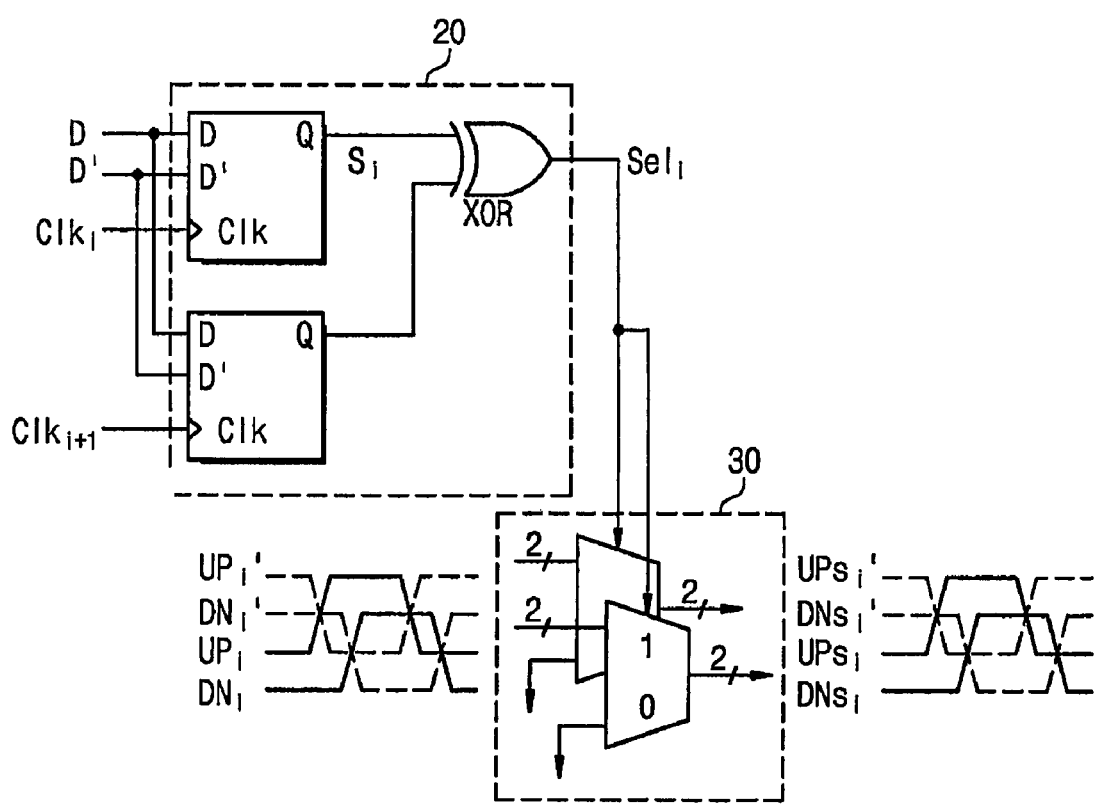
FIG. 11 is a circuit diagram illustrating the transition detector and the multiplexer shown in FIG. 10.

FIG. 11 is a circuit diagram illustrating transition detector 20 and multiplexer 30 shown in FIG. 10. Transition detector 20 is composed of two D-flip-flops the outputs of which are inputs to an XOR gate circuit. Transition detector 20 determines whether sampling values of two adjacent data values are 1 or 0 by using two clocks different in phase by 100 ps associated with the 2.5 GHZ VCO. If the two adjacent data values are different in sampling value from the XOR gate circuit, up and down pulses UPsi and DNsi having phase error information are transferred to charge pump 110 (shown n FIG. 1). Unless the two data are different in sampling value, the transmission of up and down pulses are interrupted.

Figure 12:
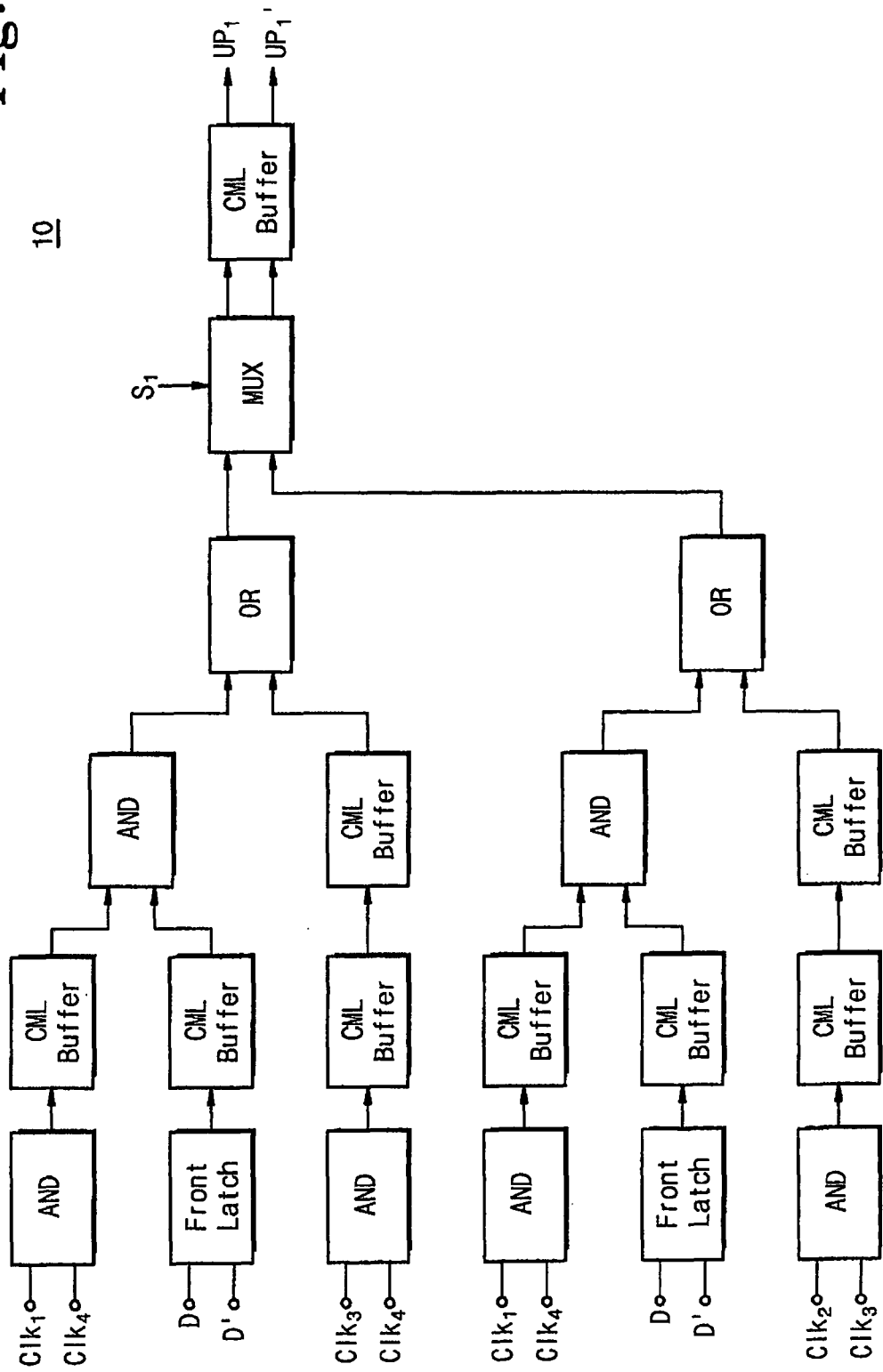
FIG. 12 is a block diagram illustrating the up/down pulse generator shown in FIG. 10.

FIG. 12 is a block diagram illustrating UP/DN pulse generator 10 shown in FIG. 10. UP/DN pulse generator 10 includes current mode logic (CML) buffers, AND gate circuits, OR gate circuits, multiplexers and first and second front latches which latch input data by means of 2.5 Gbps clocks. The front latches function to convert data D into latched data Q. Signal S1 of multiplexer 30 serves as an output value sampled through the D-flipflop of data transition detector 20. The UP/DN pulse generator 10 generates output signals UP1 and UP1' by means of signal S1. CML buffer temporarily stores data to accommodate timing with other blocks. CML buffer is implemented as a basic differential pair designed to equalize DC levels of input and output signals. Although FIG. 12 only illustrates the up pulse generator, the down pulse generator may be also similarly configured.

By generating up and down pulses in proportion to a phase error, it is possible to effectively recover data with large jitters using a linear phase detector. The linear phase detector is effective with a random input data stream and a relatively small static phase error. In addition, this type of phase detection easily generates narrow pulses by changing transition points of data for error detection, thereby raising the linearity of the phase detector. Up and down pulses are generated in proportion to the phase error to effectively recover data even with large jitters. In addition, by adding extra pulses to the up and down pulses, narrow pulses are generated extending the range of linearity.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A linear phase detector comprising:
 a data transition detector receiving data signals and configured to determine whether a transition is present in the received data signals;
 an up/down pulse generator coupled to said data transition detector and receiving said data signals and a recovered clock signal, said up/down pulse generator generating up and down pulses that have pulse widths proportional to phase differences between transitions of the data signals and edges of the recovered clock signal; and
 a multiplexer coupled to said data transition detector and said up/down pulse generator, said multiplexer receiving a selection signal from said transition detector and outputting up and down pulses at transitions of said data signals.

2. The linear phase detector as set forth in claim 1, wherein the up and down pulses are selectively output in accordance with a transition of the data.

3. The linear phase detector as set forth in claim 1, wherein the up and down pulses are output if a transition of the data is present.

4. The linear phase detector as set forth in claim 1, wherein the up and down pulses are interrupted to be output if a transition of the data is absent.

5. The linear phase detector as set forth in claim 1, wherein the up/down pulse generator is configured to add the same pulse width to the up and down pulses during fast data transmission.

6. A clock/data recovery circuit comprising:
 a voltage-controlled oscillator configured to generate a recovered clock signal;
 a phase detector configured to generate up and down pulses in response to received data signals and said recovered clock signal from said voltage-controlled oscillator, the phase detector further comprising:
  a data transition detector receiving data signals and configured to determine whether a transition is present in the received data signals;
  an up/down pulse generator coupled to said data transition detector and said received data signals and said recovered clock signal, said up/down pulse generator generating the up and down pulses that have pulse widths proportional to phase differences between transitions of the data signals and edges of the recovered clock signal; and
  a multiplexer coupled to said data transition detector and said up/down pulse generator, said multiplexer receiving a selection signal from said transition detector and outputting up and down pulses at transitions of said data signals; and
 a control circuit configured to control the voltage-controlled oscillator in response to the up and down pulses to synchronize an edge of the recovered clock signal with the center of the data signal,
 wherein the recovered clock signal comprises multiphase clock signals, and the phase detector generates up and down pulses for each of the multiphase clock signals.

7. The clock/data recovery circuit as set forth in claim 6 wherein the up and down pulses have the same pulse width when an edge of the recovered clock signal is synchronized with the center of the data signal.

8. The clock/data recovery circuit as set forth in claim 6 wherein said phase detector is configured to output the up and down pulses if a transition in the data signals is present.

9. The clock/data recovery circuit as set forth in claim 6 wherein said phase detector is configured to interrupt the up and down pulses if a transition in the data signal is absent.

10. The clock/data recovery circuit as set forth in claim 6 wherein said phase detector is configured to add the same pulse width to the up and down pulses during data transmission at a particular frequency.

11. The clock/data recovery circuit as set forth in claim 6 wherein the control circuit comprises:
 a charge pump generating a control voltage in response to the up and down pulses; and
 a filter coupled to said charge pump and configured to output the control voltage to the voltage-controlled oscillator.

* * * * *